US006469587B2

(12) United States Patent
Scoggins (10) Patent No.: US 6,469,587 B2
(45) Date of Patent: Oct. 22, 2002

(54) DIFFERENTIAL LC VOLTAGE-CONTROLLED OSCILLATOR

(75) Inventor: John E. Scoggins, Kennebunk, ME (US)

(73) Assignee: Agere Systems Guardian Corp., Miami Lakes, FL (US)

( * ) Notice: Subject to any disclaimer, the term of this patent is extended or adjusted under 35 U.S.C. 154(b) by 0 days.

(21) Appl. No.: 09/729,002

(22) Filed: Dec. 4, 2000

(65) Prior Publication Data

US 2002/0113659 A1 Aug. 22, 2002

(51) Int. Cl.[7] .................................................. H03B 5/00

(52) U.S. Cl. ............................. 331/117 R; 331/117 FE; 331/177 V; 331/182; 331/183; 331/36 C (58) Field of Search .......................... 331/36 C, 177 V, 331/117 R, 117 FE, 182, 183

(56) References Cited

U.S. PATENT DOCUMENTS 6,292,065 B1 * 9/2001 Friedman et al. ......... 331/117 R

OTHER PUBLICATIONS

"A 1.3 GHz Low–Phase Noise Fully Tunable CMOS LC VCO" by Francesco Svelto, Stefano Deantoni and Rinaldo Castello, IEEE Journal On Solid State Circuits, vol. 35, No. 3, Mar. 2000, pps. 356–361.

* cited by examiner

Primary Examiner—Arnold Kinkead
(74) Attorney, Agent, or Firm—Steve Mendelsohn; Ian M. Hughes

(57) ABSTRACT

A differential voltage-controlled oscillator (VCO) employs a pair of accumulation-mode varactors driven with a differential control voltage to generate a differential oscillating waveform. The differential control voltage is formed from a pair of level-shifted input differential control voltage components. Level shifting of the input control voltages and driving the varactors with a differential control voltage allows for biasing of the varactors over a substantial range of capacitance variation. Such differential VCO may be employed within a phase-locked loop (PLL) circuit, with the pair of input control voltages being provided by the loop filter of the PLL circuit. The differential VCO comprises a differential control voltage to voltage converter (CV2VC) coupled to an LC-tank VCO. To improve common-mode noise rejection of the LC-VCO, the inductors of the LC-tank may be AC-coupled to the supply voltage, and the output differential oscillating waveform may be AC-coupled to the LC-tank through capacitors.

14 Claims, 10 Drawing Sheets

DIFFERENTIAL LC VOLTAGE-CONTROLLED OSCILLATOR

BACKGROUND OF THE INVENTION

1. Field of the Invention

The present invention relates to electronic circuits, and, in particular, to signal generators such as voltage-controlled oscillator circuits.

2. Description of the Related Art

For many electronic applications, an oscillator circuit is employed to generate a periodic oscillating waveform. Oscillator circuits in general are implemented with a tuned amplifier with positive feedback from the output to the input, and are designed to take advantage of the instability possible in circuits having such a feedback loop. Oscillator circuits are designed with instability such that there is a frequency at which the loop gain is real and greater than one. Once drive voltage and current are applied to the circuit, the oscillator output signal oscillates between the maximum and minimum values of the amplifier output, thus generating the periodic output signal having a frequency related to the loop gain. Since a tuned amplifier is employed, the oscillator's loop gain frequency is, to a great extent, determined by the inductance (L) and capacitance (C) values used to tune the amplifier (i.e., the "tank" circuit). A voltage-controlled oscillator (VCO) is a circuit that generates a periodic output signal with frequency based on an input voltage level. In many VCOs, a varactor diode is employed since the space-charge capacitance of the varactor changes as a function of control voltage (e.g., reverse biasing voltage), thus changing the capacitance of the tank circuit. Many different circuit configurations are known in the art to implement a VCO.

As VCO output frequencies increase for radio frequency (RF) applications (e.g., above 1 GHz), many prior art VCOs implemented within an integrated circuit (IC) employ an accumulation-mode varactor. For example, a common n-well structure for an accumulation-mode varactor may be an n-channel MOS FET fabricated in an n-well (or a p-channel MOS FET fabricated in a p-well). Alternatively, the accumulation-mode varactor may be a common n-well MOS bi-polar transistor. The capacitance of the accumulation-mode varactor is formed from the combined capacitance of the oxide layer and depletion layer. The capacitance of the accumulation-mode varactor changes as the reverse bias voltage applied across the varactor changes the varactor's state between deep accumulation and strong depletion of charge in the semiconductor layers.

VCO circuits commonly employed in the prior art comprise a single-ended control voltage ($V_C$) drive circuit to provide the varying bias voltage across the varactor. Such single-ended control voltage is applied to one terminal of the varactor, while the other terminal is generally coupled to a supply voltage ($V_{DD}$) or AC-coupled through an inductor or capacitor to $V_{DD}$. The single-ended control voltage sets the variable capacitance of the varactors. Setting the variable capacitance of the varactors, in turn, tunes the LC-tank circuit to the desired operating frequency f.

Figure 1:
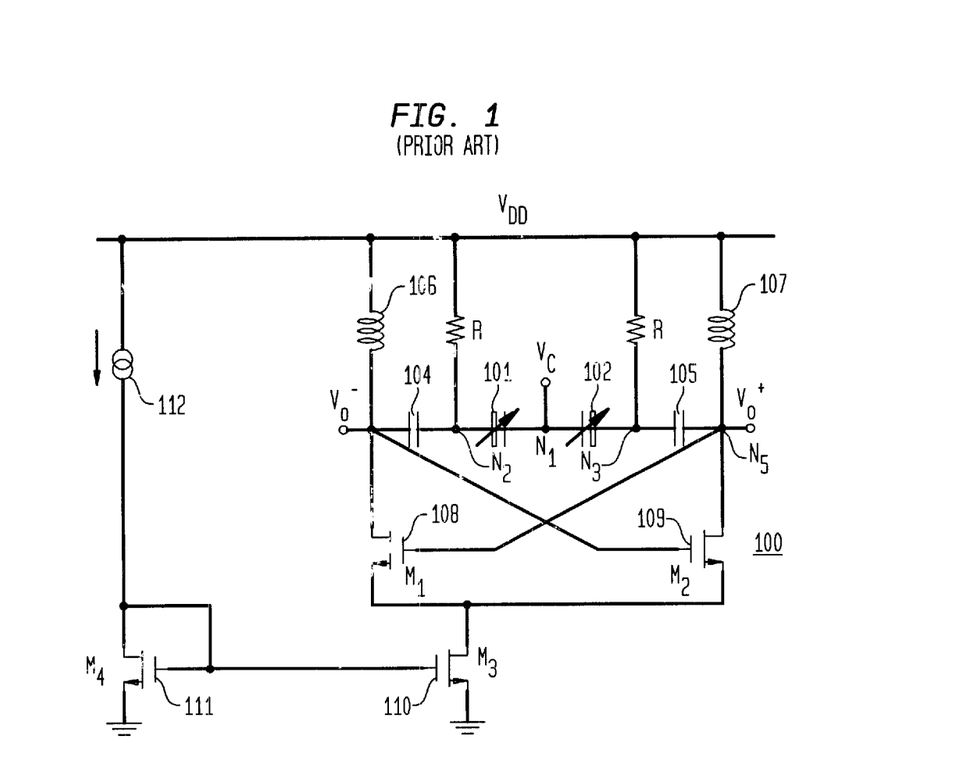
FIG. 1 shows an integrated differential LC voltage-controlled oscillator (VCO) of the prior art employing accumulation-mode varactors and operating with an output frequency above 1 GHz.

FIG. 1 shows an integrated differential LC VCO 100 of the prior art as may be implemented within an integrated circuit and operating with an output frequency above 1 GHz. In LC-VCO 100, two accumulation-mode varactors 101 and 102 are coupled back-to back in a common n-well configuration, the common n-wells of varactors 101 and 102 driven at node N1 by the DC control voltage $V_C$. The other terminal of each of varactors 101 and 102 (shown at nodes N2 and N3) is coupled through a corresponding resistor R to the supply voltage $V_{DD}$. For LC-VCO 100 of FIG. 1, the output voltages at corresponding terminals of varactors 101 and 102 (at nodes N2 and N3) are AC-coupled through capacitors 104 and 105 to nodes N4 and N5 as output voltages $V_o-$ and $V_o+$. One skilled in the art would recognize that the output voltages from varactors 101 and 102 do not necessarily have to be AC-coupled. Inductors 106 and 107 are coupled between 1) corresponding nodes N4 and N5 and 2) the supply voltage $V_{DD}$. Inductors 106 and 107 may be coupled directly between the supply voltage $V_{DD}$ and nodes N2 and N3 if the output voltages $V_o-$ and $V_o+$ are not AC-coupled.

Output voltages $V_o+$ and $V_o-$ are driven through a differential amplifier formed from cross-coupled MOS FETs M1 108 and M2 109, with M1 108 and M2 109 biased, as known in the art, via the circuit of MOS FET M3 110, MOS FET M4 111, and current source 112. Positive feedback for the differential amplifier is generally through the LC-tank formed between nodes N4, N5, and VDD. The resonant frequency f of LC-VCO 100 is determined by the LC-tank of the LC-VCO circuit (i.e., $f=2\pi\sqrt{LC}$). For the LC-tank, L is the inductance of the circuit generated from the combination of inductors 106 and 107, and C is the capacitance formed from the combination of 1) the varying capacitance of varactors 101 and 102, 2) the capacitance of capacitors 104 and 105, 3) the capacitance of the differential cross-coupled MOS FETs M1 108 and M2 109, and 4) various IC parasitic capacitance.

The single-ended control voltage (e.g., $V_C$ of FIG. 1) sets the variable capacitance of the varactors. However, use of a single-ended control voltage drive circuit provides poor common-mode noise rejection. One approach is to increase common-mode noise rejection with AC-coupling of the output voltages, such as described with respect to FIG. 1. AC-coupling adds capacitance, which reduces the amplitude of the oscillation waveform across the varactor by the capacitance divider ratio. Therefore, AC-coupling reduces phase noise effects in output voltages at the expense of lower frequency tuning range and lower VCO gain. This, and related techniques for improving common-mode noise rejection, are is described in greater detail in F. Svelto and R. Castello, "A 1.3 GHz Low-Phase Noise Fully Tunable CMOS LC-VCO", IEEE Journal on Solid State Circuits, Vol. 35, No. 3, March 2000, incorporated herein by reference.

In addition, accumulation-mode varactors have a voltage-capacitance curve in which a majority of the variation in capacitance occurs between −1 to +1 volts of change in bias voltage across the varactor. However, bias of the varactor with a single-ended control voltage may not vary capacitance over the entire voltage-capacitance curve. As illustrated in FIG. 1, prior art differential LC-VCO circuits connect one side of each varactor (shown at nodes N4 and N5) directly to a terminal of the inductor which sets the DC bias point of the varactor to the DC value appearing at the other terminal of the inductor, which is often the positive power supply $V_{DD}$. Thus, these prior art VCOs utilize only half of the variable capacitance range of each varactor, or additional circuitry is typically employed that allows for driving the varactors above and below the DC bias point.

SUMMARY OF THE INVENTION

In accordance with embodiments of the present invention, a voltage-controlled oscillator (VCO) includes a pair of varactors that are coupled in a back-to-back configuration, and are driven by a differential control voltage comprising positive and complementary control voltage components to generate an output oscillation waveform. A voltage converter is employed to amplify and shift the positive and complementary control voltage components, with respect to a VCO source voltage, to generate the intermediate differential control voltage. The output signal of the VCO is tuned, in frequency, by setting a VCO tank inductance and varying a VCO tank capacitance in accordance with the intermediate differential control voltage. The VCO LC-tank capacitance includes the capacitance of the back-to-back varactors that varies in accordance with a drive voltage across each varactor. The drive voltage is formed from the intermediate control voltage by applying one of the intermediate control voltage components to the node formed where the corresponding back-to-back varactors are coupled, and by applying the other intermediate control voltage component to a node to which the other terminal of each varactor is coupled.

In accordance with an exemplary embodiment of the present invention, a voltage-controlled oscillator (VCO) comprises an inductance/capacitance (LC) tank circuit having a pair of varactors configured back-to-back, wherein capacitance of the back-to-back varactors contributes to capacitance of the LC-tank circuit; and a differential amplifier having its differential output terminals coupled through the LC-tank circuit to its differential input terminals in a feedback path configuration. The VCO is configured to receive a differential control voltage applied across each varactor to set capacitance of each varactor; and the differential amplifier generates an oscillating waveform in the feedback path at a frequency that is a function of the capacitance and inductance of the LC-tank circuit.

BRIEF DESCRIPTION OF THE DRAWINGS

Other aspects, features, and advantages of the present invention will become more fully apparent from the following detailed description, the appended claims, and the accompanying drawings in which:

FIGS. 6(A,B) shows a schematic diagram of an implementation of the differential CV2VC shown in FIG. 3;

FIGS. 7(A,B) shows a schematic diagram of an implementation of the LC-VCO shown in FIG. 5;

DETAILED DESCRIPTION

Figure 2:
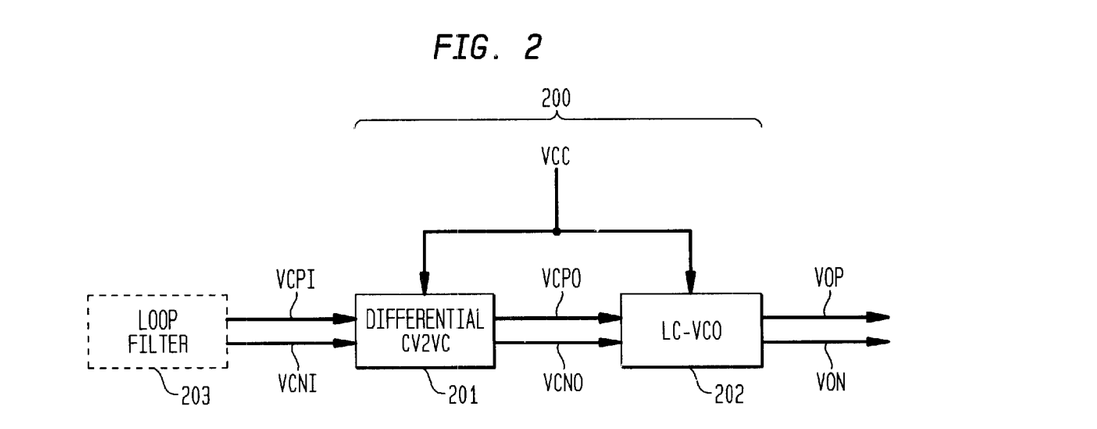
FIG. 2 shows a block diagram of an exemplary VCO circuit in accordance with an embodiment of the present invention.

In accordance with embodiments of the present invention, a differential voltage-controlled oscillator (VCO) employs a pair of accumulation-mode varactors driven with a differential control voltage to generate a differential oscillating waveform. The differential control voltage is formed from a pair of level-shifted input control voltages. Level-shifting of the input control voltages allows for biasing of the varactors over a substantial range of capacitance variation. Such differential VCO may be employed within a phase-locked loop (PLL) circuit, with the pair of input control voltages being provided by the loop filter of the PLL circuit. FIG. 2 shows a differential VCO 200 in accordance with an exemplary embodiment of the present invention and comprising a differential control voltage-to-voltage converter (CV2VC) 201 coupled to an inductor/capacitor (LC) tank VCO (LC-VCO) 202.

Differential CV2VC 201 converts the differential control voltage formed by the pair of input control voltages VCPI and VCNI provided from, for example, a PLL loop filter 203 into an intermediate differential control voltage $V_{CNTRL}$ formed by the pair VCPO and VCNO. For the exemplary embodiment described herein, the gain of differential CV2VC 201 is approximately 1.6. However, one skilled in the art would recognize that the gain for an implementation is selected to provide a intermediate differential control voltage $V_{CNTRL}$ from the input signal having a level sufficient to set the desired output frequency of VCO. The circuit components of differential CV2VC 201 are selected to limit the signal bandwidth of the input stage (e.g., signal bandwidth limited to about 100 MHz) to reject high-frequency noise while also satisfying typical VCO modulation bandwidth design criteria. Differential CV2VC 201 desirably exhibits a relatively high input impedance to reduce or otherwise minimize leakage current from, for example, loop filter 203. Differential CV2VC 201 desirably exhibits relatively low output impedance that allows for setting of VCO modulation bandwidth independently of transistor parameters.

For the exemplary embodiment described herein, each component of the input and intermediate differential control voltages varies between +1 V and −1 V about a corresponding DC offset level. Differential VCO 200 generally operates with reference to a supply voltage $V_{cc}$. The intermediate differential control voltage $V_{CNTRL}$ is employed to drive each varactor (e.g., accumulation-mode MOS varactor) of LC-VCO 202, as described subsequently with respect to FIG. 5. Differential CV2VC 201 provides some gain or attenuation, depending on the particular circuit design, as well as DC-level-shifting with respect to the supply voltage $V_{CC}$. For example, an input +1 V differential control voltage is formed from VCPI equal to ($V_{CC}$−0.6) V and VCNI equal to ($V_{CC}$−1.6) V, and a −1 V differential control voltage is formed from VCPI equal to ($V_{CC}$31 1.6) V and VCNI equal to ($V_{CC}$−0.6) V. As is known in the art, use of differential voltage signals has an advantage in that added noise to the signal tends to affect each component similarly, and thus cancels itself out in the differential signal when components are combined. Differential control voltage $V_{CNTRL}$ drives LC-VCO 202 to generate a differential oscillating waveform formed between Vop and VON. LC-VCO 202 is a voltage-controlled oscillator employing back-to-back accumulation-mode varactors (not shown in FIG. 2) biased by the differential voltage $V_{CNTRL}$, and having an oscillation frequency determined by the tank inductance L and tank capacitance C of LC-VCO 202. The common-node terminal of the back-to-back varactors is driven by the positive component VCPO of differential control voltage $V_{CNTRL}$. The other terminal of each varactor is 1) driven by the complementary component VCNO of $V_{CNTRL}$, and 2) AC-coupled to the supply voltage $V_{CC}$ through a corresponding inductance.

LC-tank capacitance for LC-VCO 202 may generally be a combination of the capacitance of the varactors, the capacitance of the transistors employed to drive the various node voltages, the capacitances of capacitors used to AC-couple the back-to-back configuration to the output nodes for $V_{OP}$ and $V_{ON}$, and various parasitic capacitances within the particular circuit implementation. Inductance for LC-VCO 202 may generally be a combination of the inductance of inductors coupled between the varactors and the supply voltage. In accordance with the present invention, the differential control voltage $V_{CNTRL}$ thus drives the accumulation-mode varactors of LC-VCO 202 such that capacitance of each varactor may be varied over a relatively large range (e.g., substantially all of the linear range of capacitance versus voltage) to tune the LC-tank of LC-VCO 202. In addition, the differential control voltage Vc utilizes approximately half of the voltage headroom provided from the supply voltage Vcc.

Figure 3:
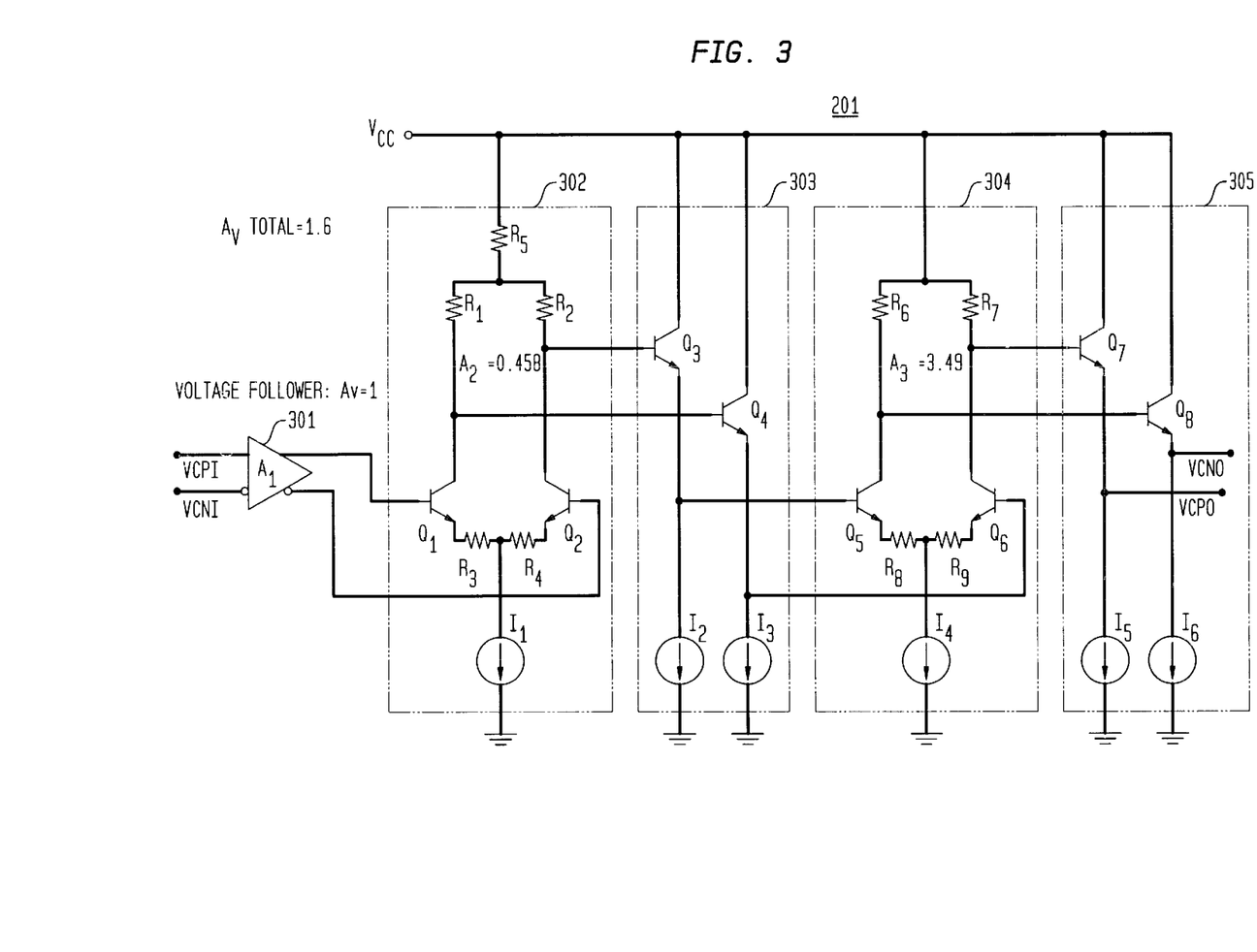
FIG. 3 shows a schematic diagram of an exemplary circuit implementation for the differential control voltage to voltage converter (CV2VC) circuit of FIG. 2.

FIG. 3 shows a schematic diagram of an exemplary circuit implementation for the differential CV2VC 201 of FIG. 2. Differential CV2VC 201 comprises a voltage-follower amplifier 301, first differential amplifier stage 302, first bi-polar voltage driver pair 303, second differential amplifier stage 304, and second bi-polar voltage driver pair 305. As would be apparent to one skilled in the art, circuit component values for a given implementation of differential CV2VC 201 are dependent on the operating frequency range for the desired oscillation waveform. The overall voltage gain and level-shifting of the input differential control voltage by differential CV2VC 201 sets the differential control voltage $V_{CNTRL}$ to utilize substantially all of the linear region of the capacitance-voltage (C-V) characteristic curve of, for example, a varactor when employed in the LC-VCO 202.

Figure 4:
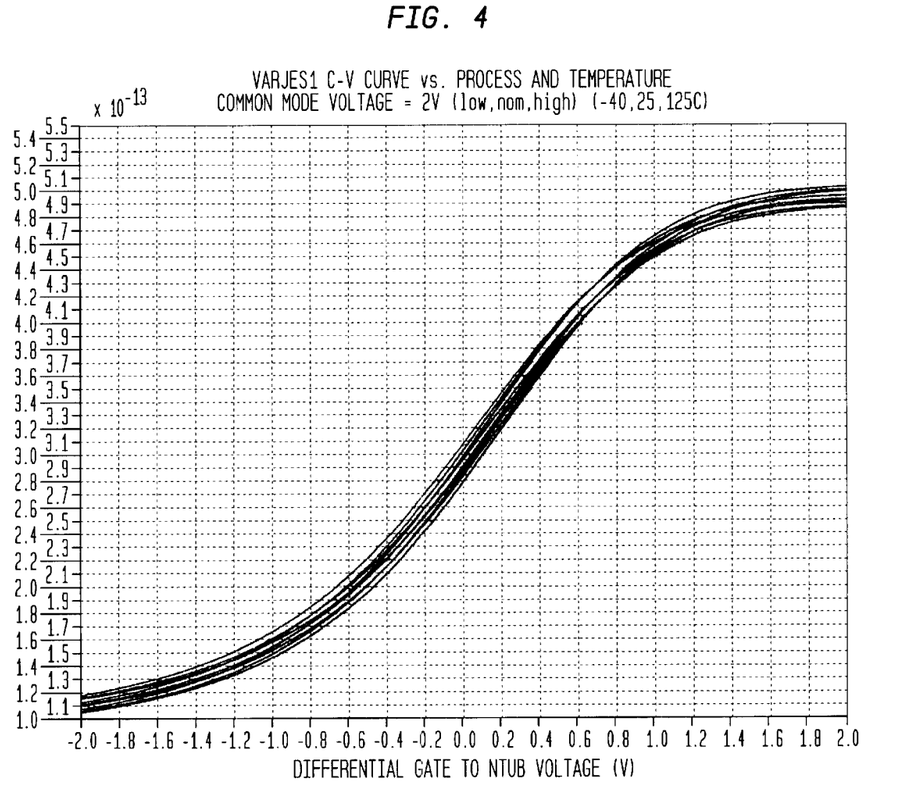
FIG. 4 shows exemplary characteristic curves of capacitance versus differential gate voltage for different operating conditions of an accumulation-mode varactor that may be employed in the differential VCO circuit of FIG. 2.

FIG. 4 shows exemplary characteristic curves of capacitance versus differential gate voltage (C-V characteristic curve) for different operating conditions (e.g., temperature) of an accumulation-mode varactor employed in the LC-VCO 202 of FIG. 2. As shown in FIG. 4, the C-V characteristic curve is nearly linear between +1 V and −1 V of differential gate voltage. The differential control voltage $V_{CNTRL}$ is applied as a differential signal across the gate and the common n-tub of each varactor, and it is desirable for the differential control voltage $V_{CNTRL}$ to vary capacitance through the linear region of the C-V characteristic curve.

Given a varactor having the exemplary C-V characteristic curves of FIG. 4 and a target oscillation waveform frequency of about 10 GHz, an exemplary set of circuit component values for a differential CV2VC 201 such as shown in FIG. 3 may be determined. Table 1 lists the exemplary set of circuit component values for differential CV2VC 201 shown in FIG. 3.

TABLE 1

| Component | Value |
|---|---|
| $R_1$ | 500 ohms |
| $R_2$ | 500 ohms |
| $R_3$ | 1000 ohms |
| $R_4$ | 1000 ohms |
| $R_5$ | 500 ohms |
| $R_6$ | 2000 ohms |
| $R_7$ | 2000 ohms |
| $R_8$ | 500 ohms |
| $R_9$ | 500 ohms |

Returning to FIG. 3, control voltage input signals VCPI and VCNI are applied to voltage-follower amplifier 301. To provide relatively high common-mode noise rejection, amplifier 301 is in cascade with the first differential amplifier stage 302. The output from the first differential amplifier stage 302 drives, through first bi-polar voltage driver pair 303, second differential amplifier stage 304. The output from the second differential amplifier stage 304 drives, through second bi-polar voltage driver pair 305, the varactor control voltages VCPO and VCNO. Varactor control voltages VCPO and VCNO form the differential voltage $V_{CNTRL}$ input to LC-VCO 202. The product of the voltage gains of voltage-follower amplifier 301 and first and second differential amplifier stages 302 and 304 thus shapes the input control voltages into the differential control voltage VCNL that changes the capacitance of the accumulation-mode varactors employed by LC-VCO 202.

Voltage-follower amplifier 301 may be configured to provide a unity gain and present a high input impedance to reduce or minimize leakage current from, for example, the loop filter generating the input voltages VCPI and VCNI. Voltage-follower amplifier 301 may be provided with a compensation capacitor coupled between each output and $V_{CC}$ (not shown in FIG. 3) to set the bandwidth of the first amplifier stage 302. For the exemplary circuit implementation of the differential CV2VC 201 having components as given in Table 1, voltage-follower amplifier 301 may be implemented as a pair of source-coupled n-channel devices (e.g., FETs). For the exemplary embodiment described herein, voltage-follower amplifier 301 is desirably $V_{CC}$-referenced, relatively high input impedance voltage amplifier employing a 2 pF compensation capacitor to limit the bandwidth of first amplifier stage 302 to about 100 MHz.

First differential amplifier stage 302 comprises two linear emitter-coupled amplifiers $Q_1$ and $Q_2$ with corresponding current source $I_1$. First differential amplifier stage 302 provides signal attenuation to allow for shifting of DC level in the signal provided by voltage-follower amplifier 301, as well as to prevent saturation of the following first bipolar voltage driver pair 303 comprising transistors $Q_3$ and $Q_4$ and current sources $I_2$ and $I_3$. Transistors $Q_3$ and $Q_4$ of first bipolar voltage driver pair 303 may be implemented with SiGe bipolar transistors.

The gain of first differential amplifier stage 302 is set by the ratio of resistor $R_1$ to resistor $R_3$ (or $R_2/R_4$), which is 0.5 for the values of Table 1. The shift in DC level is substantially set by the value of resistor $R_5$. For $R_5$=500 ohms, a 500 mV DC level shift is provided to the differential signal in addition to any level shift added by first bipolar voltage driver pair 303 (output voltages of emitter-follower configuration $Q_3$ and Q4). This DC level shift provides the necessary headroom for the output voltage swing of the final stage.

First bipolar voltage driver pair 303 is a pair of linear amplifiers each referenced to $V_{CC}$ to provide isolation between first and second differential amplifier stages 302 and 304. First bipolar voltage driver pair 303 also provides voltage sufficient to drive the collectors of the corresponding circuit components $Q_5$ and $Q_6$ in the second amplifier stage 304. Each linear amplifier is a bipolar transistor (shown as $Q_3$ and $Q_4$) in an emitter-follower configuration with a current source (shown as corresponding current sources $I_2$ and $I_3$).

Similarly, second differential amplifier stage 304 comprises two linear emitter-coupled amplifiers $Q_5$ and $Q_6$ with corresponding current source $I_4$, which is substantially equal to $I_1$. Gain of second differential amplifier stage 304 is set by the ratio of resistor R6 to resistor R8 (or R7/R9), which is 4.0 for the values of Table 1.

Second bipolar voltage driver pair 305 comprises a pair of linear amplifiers, each referenced to $V_{CC}$ to provide isolation between the second amplifier stage 304 and subsequent circuitry coupled to the output terminals of differential CV2VC 201. Second bipolar voltage driver pair 305 also provides voltage sufficient to drive the varactor control voltages VCNO and VCPO that are input to LC-VCO 202. Each linear amplifier is a bipolar transistor (shown as $Q_7$ and $Q_8$) in an emitter-follower configuration with a current source (shown as corresponding current sources $I_5$ and $I_6$).

The output impedance of the exemplary circuit of FIG. 3 is the combination of resistor R6/Beta plus Q8's emitter resistance. This output impedance is more than a decade lower than the resistance used to set the modulation bandwidth in LC-VCO 202 (as described subsequently).

Figure 5:
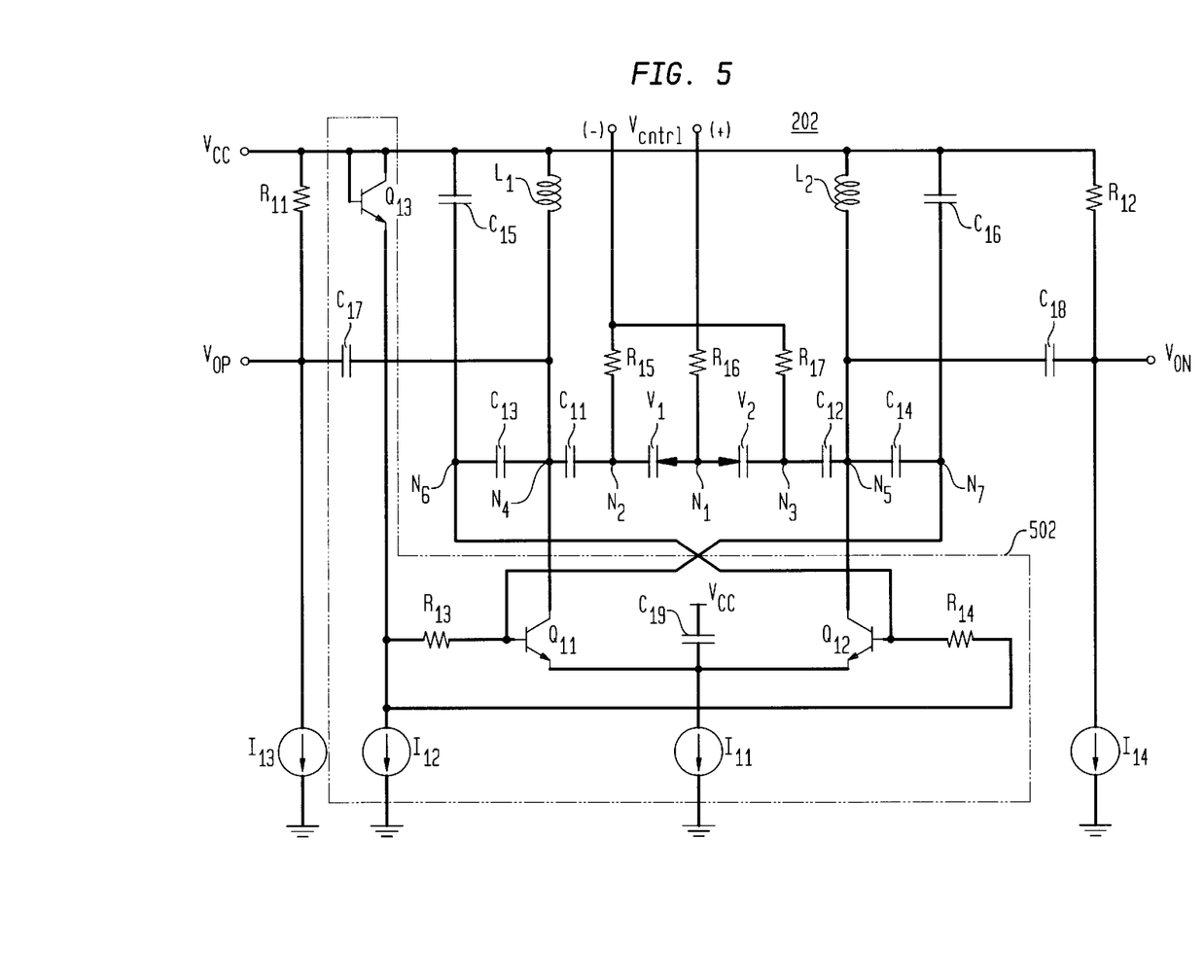
FIG. 5 shows a schematic diagram of an exemplary circuit implementation for the LC-VCO circuit of FIG. 2.

FIG. 5 shows a schematic diagram of an exemplary implementation for LC-VCO 202 of FIG. 2 employing a tuned, cross-coupled amplifier 502 with positive feedback and employing a pair of accumulation-mode varactors $V_1$ and $V_2$. In LC-VCO 202, accumulation-mode varactors $V_1$ and $V_2$ are coupled back-to back within a common n-well configuration at node $N_1$. The common n-well terminal of varactors $V_1$ and $V_2$ is driven through resistor $R_{16}$ by the positive varactor control voltage VCPO of differential control voltage $V_{CNTRL}$ generated by differential (U2VC201). The other terminal of each of varactors $V_1$ and $V_2$ (shown at nodes $N_2$ and $N_3$) is coupled through a corresponding resistor ($R_{15}$ and $R_{17}$) to the complement varactor control voltage VCNO of differential control voltage $V_{CNTRL}$. As described previously with respect to FIG. 4, the capacitance of each of the accumulation-mode varactors $V_1$ and $V_2$ is set via the differential control voltage $V_{CNTRL}$.

As shown in FIG. 5, one terminal of each of varactors $V_1$ and $V_2$, at nodes $N_2$ and $N_3$, is AC-coupled to the supply voltage $V_{CC}$. AC coupling of node $N_2$ to $V_{CC}$ is via corresponding capacitor $C_{11}$ in series with inductor $L_1$, and AC coupling of node $N_3$ to $V_{CC}$ is via corresponding capacitor $C_{12}$ in series with inductor $L_2$. Circuit components $L_1$, $L_2$, $V_1$, $V_2$, $C_{11}$, $C_{12}$, $C_{13}$, $C_{14}$, $C_{15}$, and $C_{16}$, configured as shown in FIG. 5 with respect to $V_{CC}$ and $V_{CNTRL}$ in combination with 1) capacitors $C_{17}$ and $C_{18}$ for AC-coupling of the output voltages $V_{OP}$ and $V_{ON}$, and 2) the capacitance (primarily parasitic) of cross-coupled amplifier 502 forms the LC-tank circuit of LC-VCO 202.

Cross-coupled amplifier 502 generates a differential oscillating waveform that appears throughout the positive feedback path based on the natural instability of the feedback circuit design, with the frequency f of the oscillation waveform determined by the inductance L and capacitance C of the LC-tank circuit. Cross-coupled amplifier 302 comprises cross-coupled bipolar transistors $Q_{11}$ and $Q_{12}$, bi-polar transistor $Q_{13}$, resistors $R_{13}$ and $R_{14}$, capacitor $C_{19}$, current sources $I_{11}$ and $I_{12}$. Cross-coupled bi-polar transistor amplifiers $Q_{11}$ and $Q_{12}$ are biased to operate as a differential amplifier via the configuration of bi-polar transistor $Q_{13}$ and current sources $I_{11}$ $I_{12}$.

VCO circuits may be implemented as a differential amplifier with positive feedback, and one skilled in the art would realize that cross-coupled amplifier 502 is a differential amplifier. Cross-coupled amplifier 502 is configured with differential input voltages from nodes $N_6$ and $N_7$ that are applied to the corresponding bases of cross-coupled bi-polar transistors $Q_{11}$ and $Q_{12}$. Differential output voltages of cross-coupled amplifier 502 appear at the nodes $N_4$ and $N_5$ from corresponding collectors of cross-coupled bi-polar transistors $Q_{11}$ and $Q_{12}$. The feedback path between the differential input and output voltages is formed via coupling of node $N_4$ to $N_6$ and node $N_5$ to $N_7$. Nodes $N_4$ and $N_6$ are coupled by i) $C_3$ and ii) the configuration of $L_1$ and $C_{15}$ to $V_{CC}$. $N_5$ and $N_7$ are coupled by i) $C_{14}$ and ii) the configuration of $L_2$ and $C_{16}$ to $V_{CC}$. Resistors $R_{13}$ and $R_{14}$ add in series and the resulting resistance value sets the critical pole for modulation bandwidth of LC-VCO 202. Resistors $R_{13}$ and $R_{14}$ set the modulation bandwidth because of the inverse relationship between the selectivity Q (related to L/R, where $L=(L_1+L_2)$ and $R=(R_1+R_2)$) of the circuit and the modulation bandwidth. Capacitor $C_{19}$ is coupled between the supply voltage $V_{CC}$ and the coupled emitters of cross-coupled bi-polar transistors $Q_{11}$ and $Q_{12}$, and capacitor $C_{19}$ is employed to tune the tank and the modulation bandwidth of the LC-VCO 202.

As shown in FIG. 5, the differential oscillating waveform output from LC-VCO 202 is formed from $V_{OP}$ and $V_{ON}$. Differential oscillating waveform is provided from LC-VCO 202 by AC-coupling, via capacitors $C_{17}$ and $C_{18}$, of differential oscillating waveform voltage components appearing at nodes $N_4$ and $N_5$ to the output as voltages $V_{OP}$ and $V_{ON}$. AC-coupling of the output oscillation waveform from the terminals of varactors $V_1$ and $V_2$ reduces the amplitude of the oscillation waveform voltage component seen by each of the varactors $V_1$ and $V_2$. The oscillation waveform voltage component seen across each of the varactors $V_1$ and $V_2$ is reduced in accordance with the capacitance divider ratio for two capacitors in series, allowing for greater amplitude of oscillation for the differential VCO while generating less non-linear distortion. The voltage across $V_1$ is thus the voltage at node $N_2$ (VN2) minus the voltage at node $N_1$ (VN1) (which is $(C_{11}/(C_{11}+V_1))*(VN4-VN1)$). Resistors $R_{11}$ and $R_{12}$, in combination with current sources $I_{13}$ and $I_{14}$, are also employed to reference (or "anchor") the corresponding output voltages $V_{OP}$ and $V_{ON}$ with respect to the supply voltage $V_{CC}$ and to adjust output impedance of LC-VCO 202.

Table 2 lists an exemplary set of component values for LC-VCO 202 of FIG. 5:

TABLE 2

| Component | Value | Component | Value |
|---|---|---|---|
| $C_{11}$ | 800 fF | $L_2$ | 500 pH |
| $C_{12}$ | 800 fF | $R_{11}$ | 12 Kohm |
| $C_{13}$ | 65 fF | $R_{12}$ | 12 Kohm |
| $C_{14}$ | 65 fF | $R_{13}$ | 2 Kohm |
| $C_{15}$ | 200 fF | $R_{14}$ | 2 Kohm |
| $C_{16}$ | 200 fF | $R_{15}$ | 2 Kohm |
| $C_{17}$ | 56 fF | $R_{16}$ | 4 Kohm |
| $C_{18}$ | 56 fF | $R_{17}$ | 2 Kohm |

TABLE 2-continued

| Component | Value | Component | Value |
| --- | --- | --- | --- |
| $C_{19}$ | 10 pF | $V_1$ | 125–500 fF |
| $L_1$ | 500 pH | $V_2$ | 125–500 fF |

As known in the art, the resonant frequency f of the VCO 200 of FIG. 2 is determined by the LC-tank of LC-VCO 202 (i.e., $f=2\pi\sqrt{LC}$). For the LC-tank of LC-VCO 202 in accordance with the present invention, L is generally the series combination of (i.e., the sum of) inductors L1 and L2 shown in FIG. 5, though inductance may be influenced by inductance of other IC components and wire bonding. For the LC-tank of LC-VCO 202, the value for C is generally more difficult to calculate expressly, being not only the combination of varactors and capacitors themselves, but also the capacitance added by the transistors and other parasitic IC device capacitance. Tank inductance L is given in equation (1), and tank capacitance C for the circuit shown in FIG. 5 may be approximated as $C_{total}$ given in equations (2) through (11):

$$L = L_1 + L_2 \quad (1)$$

$$C_{total} = (CT7 + CT8 + CT9); \quad (2)$$

where CT1 through CT9 are:

$$CT1 = 1/((1/C_{11}) + (1/V_1)) \quad (3)$$

$$CT2 = 1/((1/C_{12}) + (1/V_2)) \quad (4)$$

$$CT3 = 1/((1/C_{13}) + (1/C_{15})) \quad (5)$$

$$CT4 = 1/((1/C_{14}) + (1/C_{16})) \quad (6)$$

CT5 = All parasitic capacitances to AC ground from $Q_{11}$'s collector (7)

CT6 = All parasitic capacitances to AC ground from $Q_{12}$'s collector (8)

$$CT7 = 1/((1/CT1) + (1/CT2)) \quad (9)$$

$$CT8 = 1/((1/CT3) + (1/CT4)) \quad (10)$$

$$CT9 = 1/((1/CT5) + (1/CT6)) \quad (11)$$

For the exemplary implementation with circuit components as given in Tables 1 and 2, the capacitances may vary over frequency, temperature, and manufacturing process. Minimum (min), maximum (max), and mid-range values for equations (1) through (11) for the exemplary implementation are given in Table 3:

TABLE 3

Figure 6A:
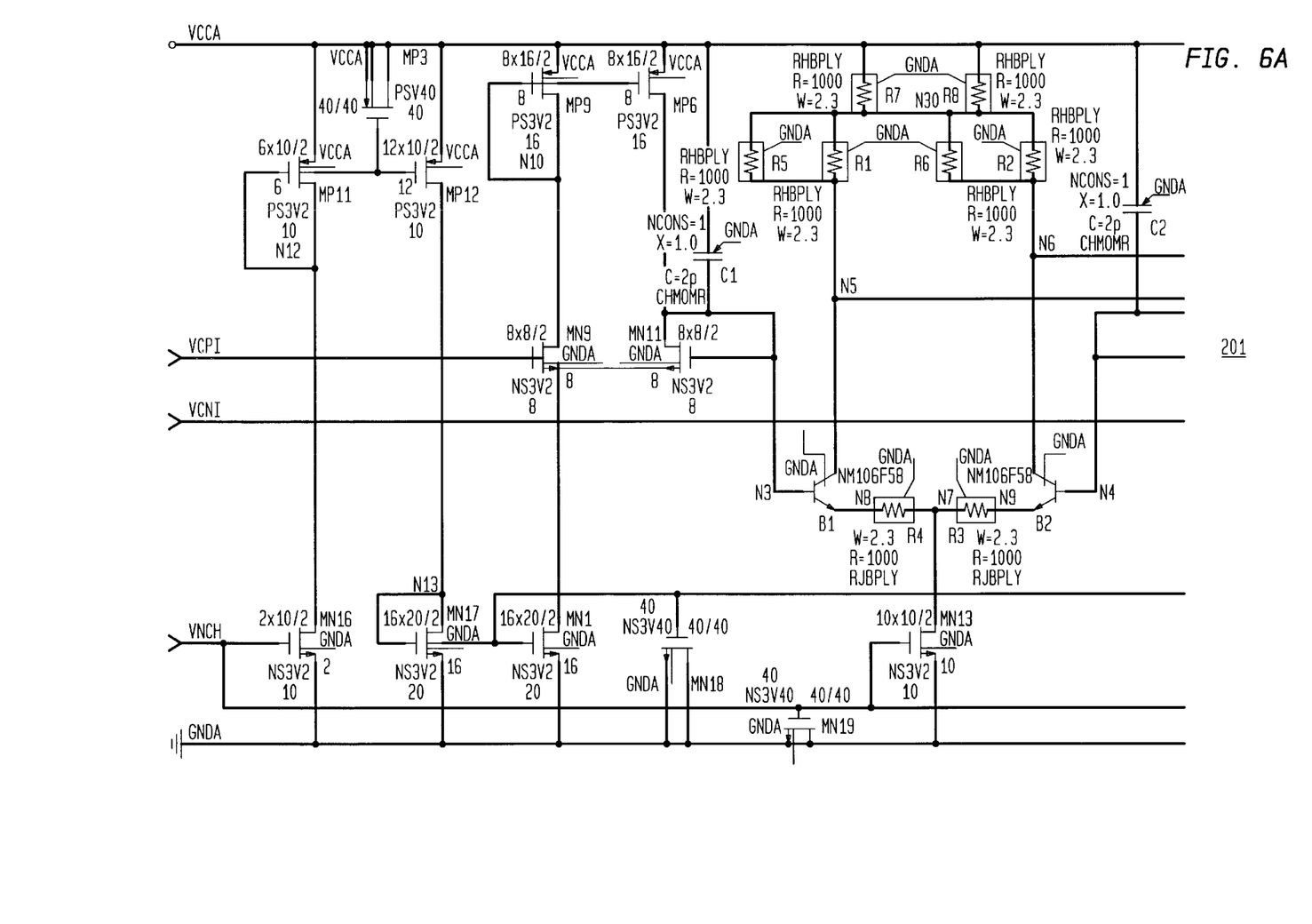
Figure 6B:
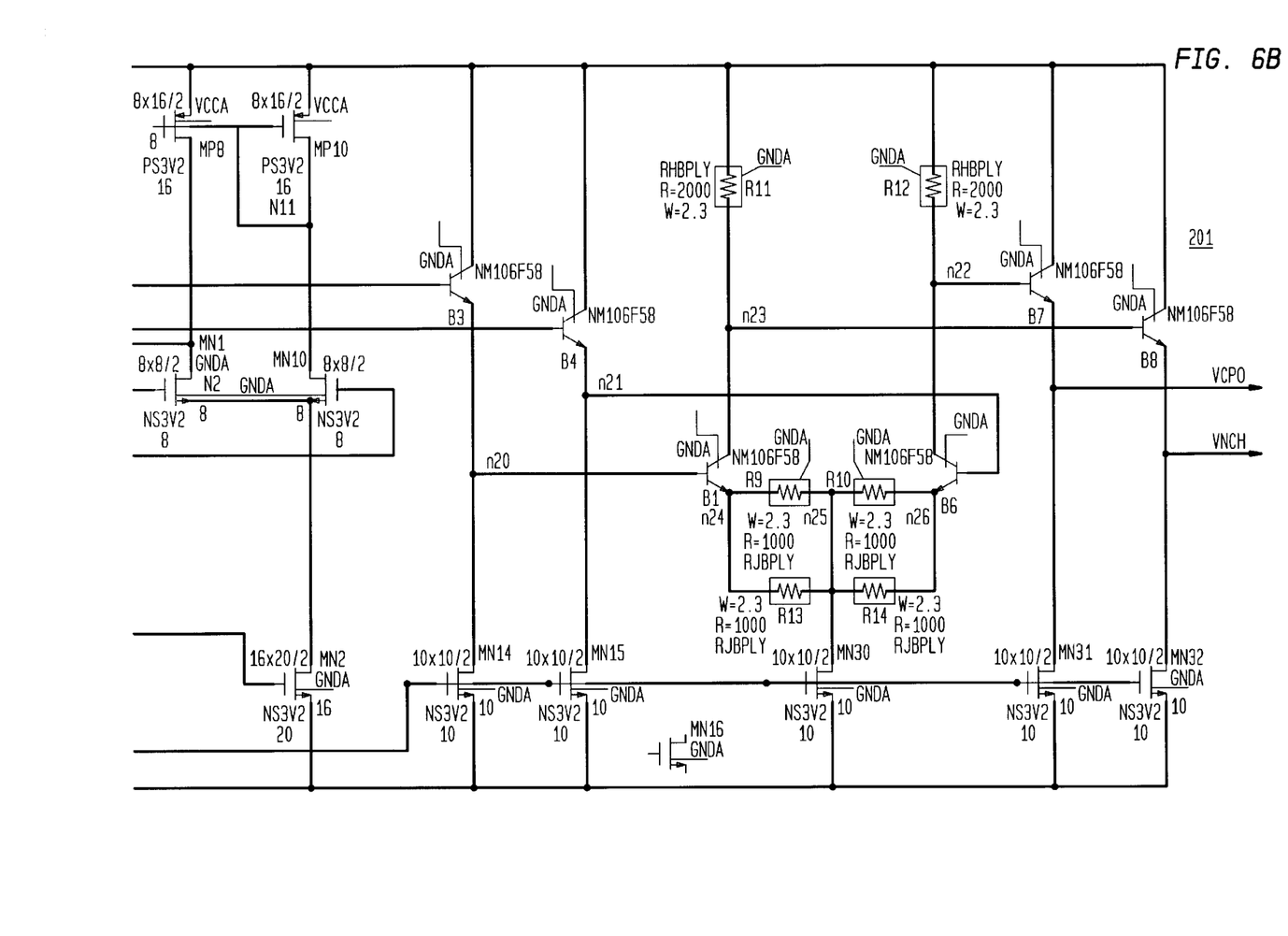
Figure 7A:
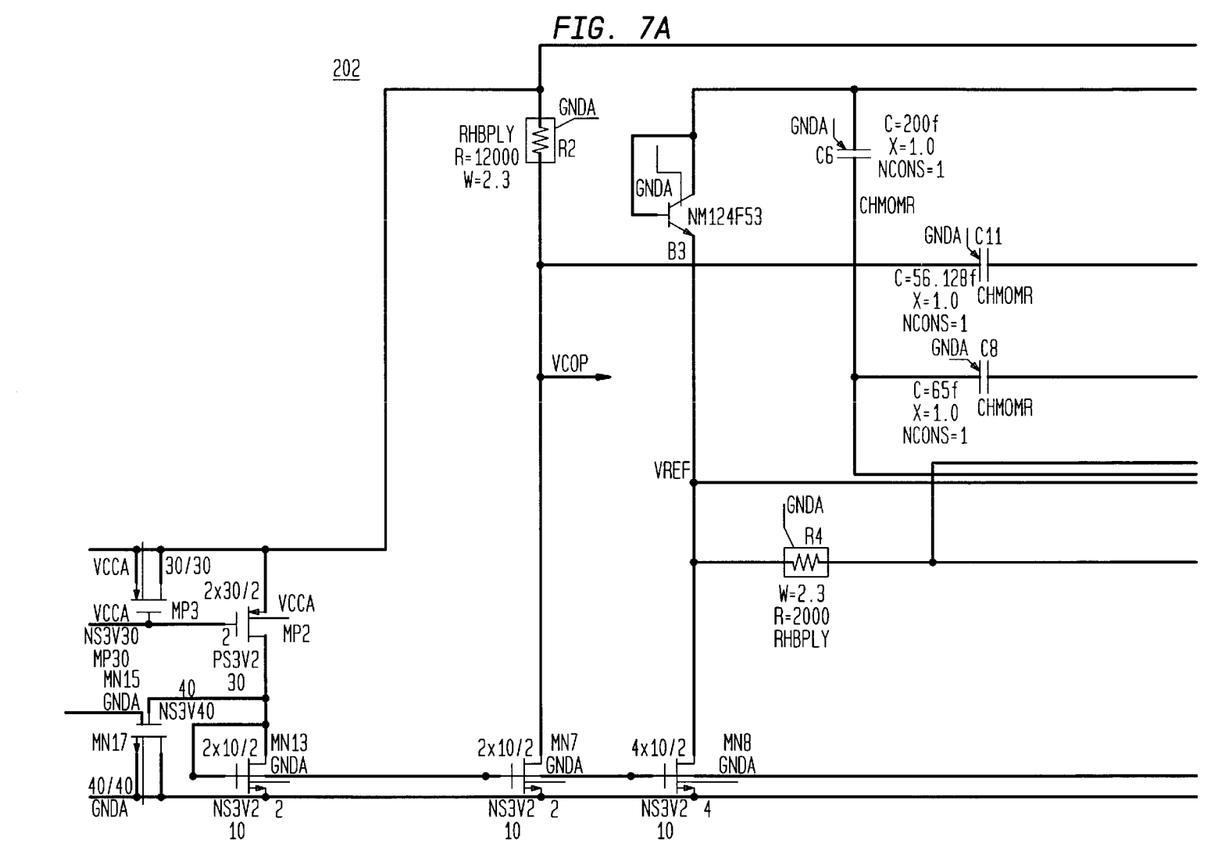
Figure 7B:
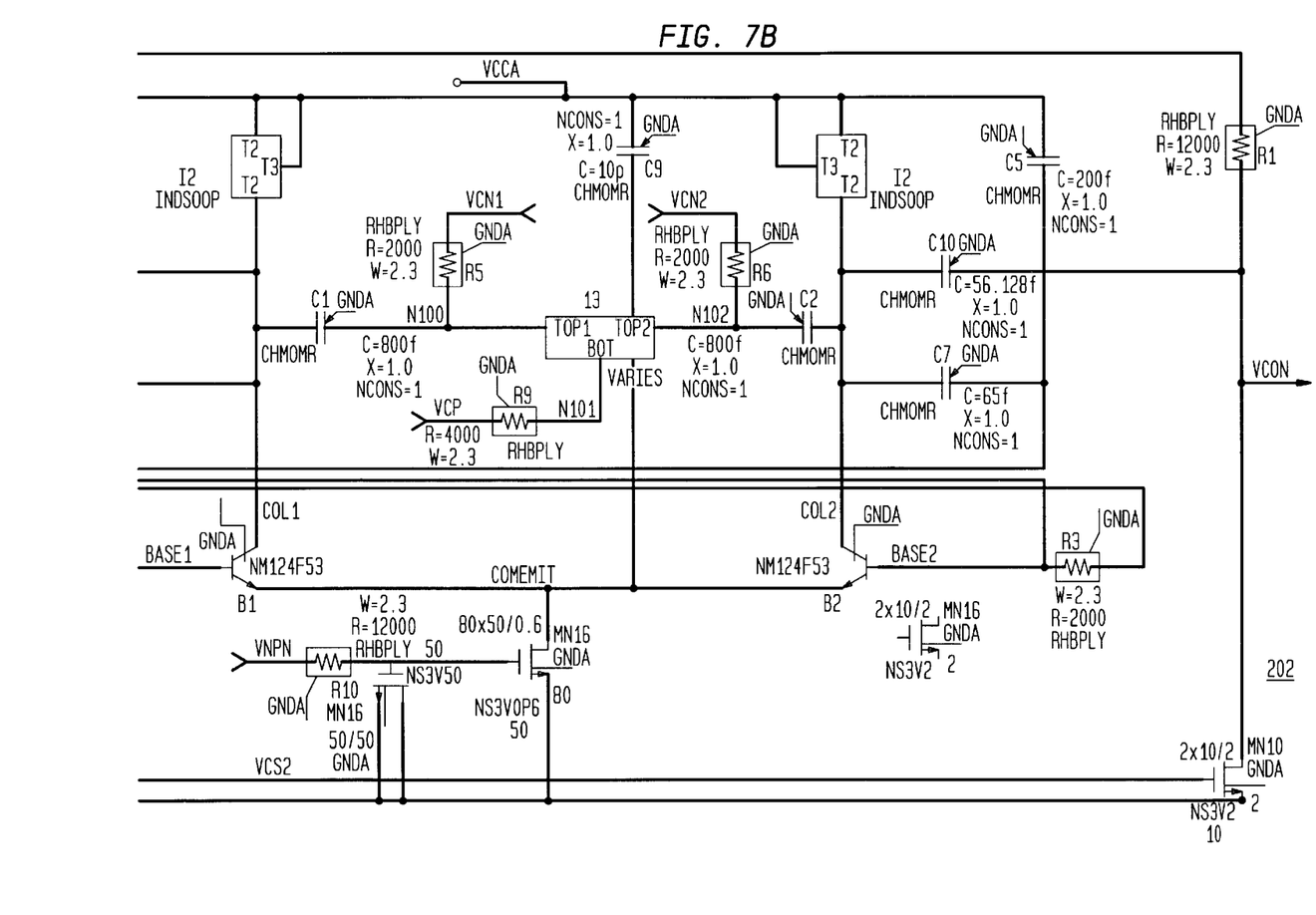

CT1 min = CT2 min = 108 fF
CT1 mid = CT2 mid = 218 fF
CT1 max = CT1 max = 307 fF
CT3 = 49 fF
CT4 = 49 fF
CT5 and CT6 are each approximately 240 fF, which includes the capacitance due to the inductor seen at the collector of Q1, the CCS of Q1,
and all inner-connect parasitic capacitance at the collector of Q1.
CT7 min = 54 fF
CT7 mid = 109 fF
CT7 max = 154 fF
CT8 = 24.5 fF
CT9 = 120 fF
L = $L_1 + L_2$ = 1 nH
$C_{total}$ min = 198.5 fF
$C_{total}$ mid = 253.5 fF
$C_{total}$ max = 298.5 fF
fmax = 11.3 GHz
fmid = 10 GHz
fmin = 9.2 GHz FIG. 6 and FIG. 7 show schematic diagrams of particular circuit implementations for the exemplary circuit diagrams of the differential CV2VC 201 shown in FIG. 3 and the LC-VCO 202 shown in FIG. 5, respectively. Operating performance for these implementations is illustrated with reference to FIGS. 8–12.

For the circuit of FIG. 6, the theoretical gain value for first differential amplifier stage is 0.5, but, in practice, various transistor parameters affect this gain, and, for the exemplary implementation, a gain of about 0.458 V/V will typically be achieved. Similarly, the calculated gain of second differential amplifier stage is 4, but in practice a gain of about 3.49V/V will typically be achieved. For the exemplary implementation, the headroom is approximately $V_{CC}$–0.5–0.25–$V_{be}$ (about $V_{CC}$–1.65 V, and where $V_{be}$ is the base-to-emitter voltage). The output impedance of the exemplary circuit of FIG. 3 is about 45 ohms, due to the combination of resistor R6/Beta=2000/100(=20) plus Q8's emitter resistance Re (Re=25) ohms. This output impedance is more than a decade lower than the resistance used to set the modulation bandwidth in LC-VCO 202 (as described subsequently). The circuit of FIG. 6 has relatively good common-mode rejection, and has relatively linear gain over the operating range of the differential input voltage of +/–1 V about a common mode of $V_{CC}$–1.1 V. The circuit operates from a $V_{CC}$ supply of 3.3 V, +/–10%. In addition, the exemplary circuit implementation produces a +/–1.6 V output voltage that tends to maximize the variable capacitance range of the accumulation-mode MOS varactors used in the LC-VCO 202 shown in FIG. 7.

Figure 8:
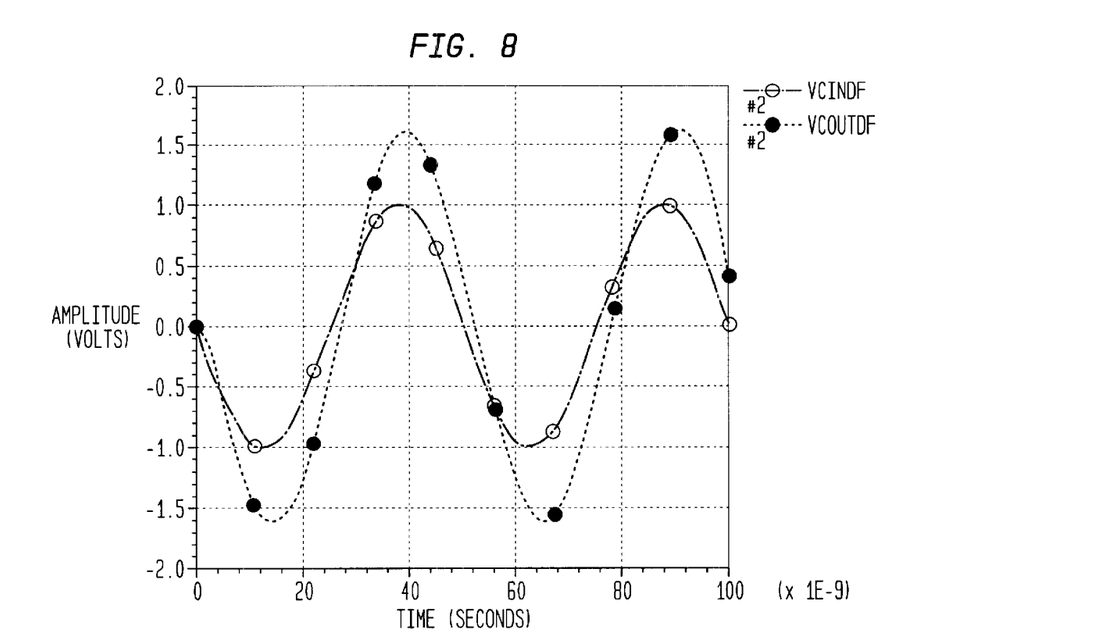
FIG. 8 is a graph of signal level versus time illustrating the overall AC gain for the differential control voltage passing through the differential CV2VC of FIG. 6.

FIG. 8 is a graph of differential input and output signal level versus time illustrating the overall AC gain for the differential control voltage that passes through differential CV2VC 201. The dotted-dashed waveform VCINDF is the input differential control voltage applied between VCPI and VCNI in FIG. 3. The dotted waveform VCOUTDF is the output differential control voltage $V_{CNTRL}$ between VCNO and VCPO in FIG. 3 (and input to LC-VCO 202 in FIG. 5). The AC gain shown in FIG. 8 is approximately 1.6 V/V.

Figure 9:
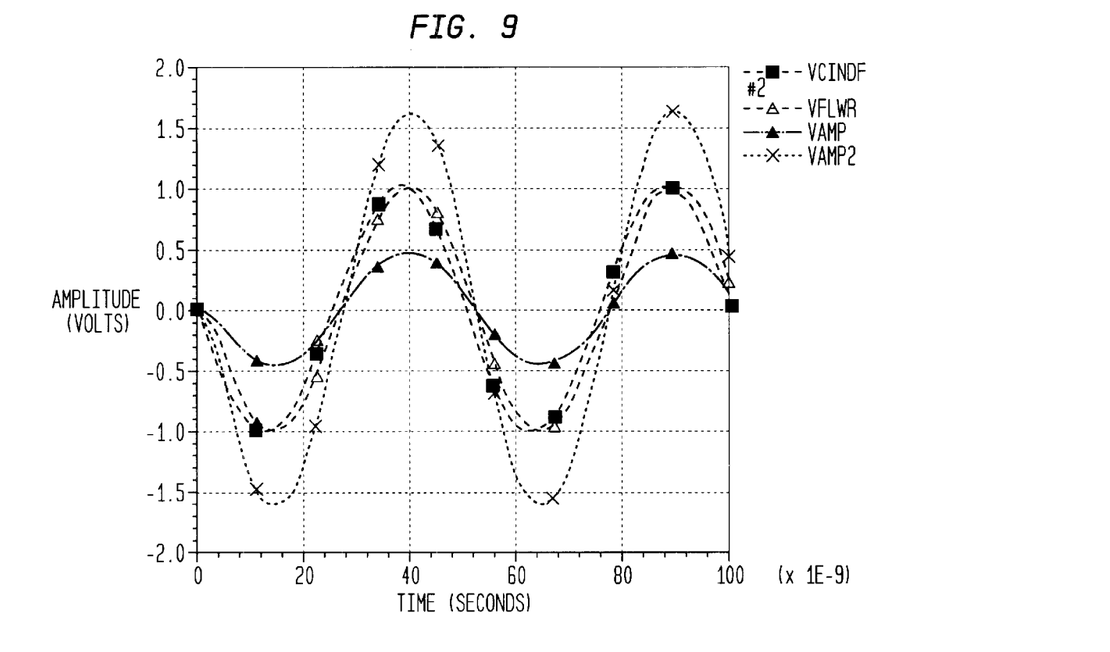
FIG. 9 is a graph of signal level versus time illustrating the overall AC gain for the differential control voltage appearing at different circuit element nodes of differential CV2VC of FIG. 6.

FIG. 9 is a graph of signal levels versus time illustrating the overall AC gain for the differential control voltage appearing at different circuit element nodes of CV2VC 201 of FIG. 3. As shown in FIG. 9, VCINDF is a 1 V peak 10MHz differential waveform. The output of voltage-follower amplifier 301 is dashed waveform VFLWR. The maximum amplitude of VFLWR is approximately 1 V at the peak, but delayed in time from the input signal VCINDF. The waveforms VAMP and VAMP2 are the transient and steady-state output signals of the second voltage driver pair 305.

Figure 10:
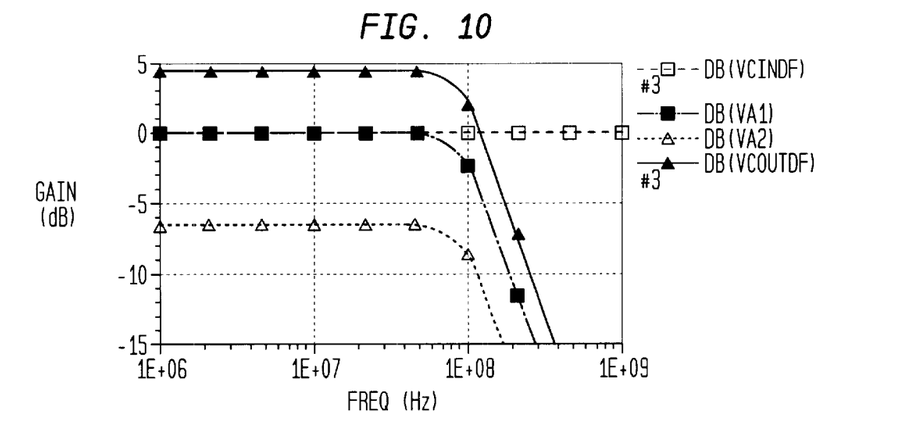
FIG. 10 shows AC gain versus frequency showing signals of differential CV2VC of FIG. 6.
Figure 11:
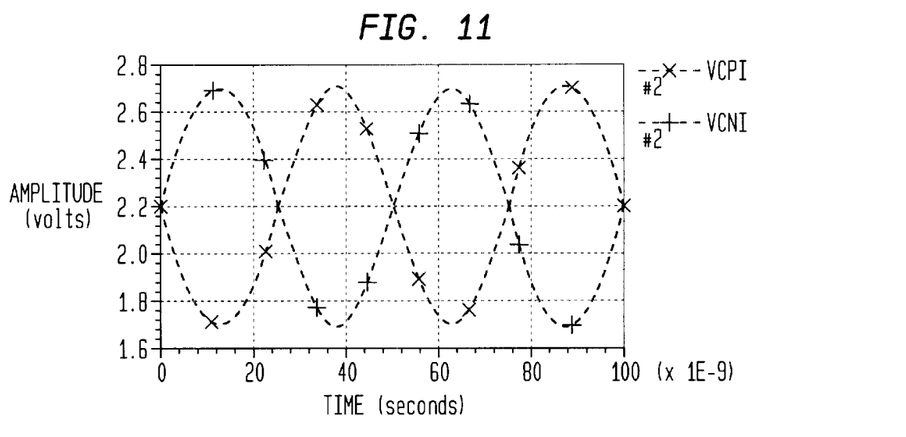
FIG. 11 shows the single-ended waveforms for VCPI and VCNI input to differential CV2VC of FIG. 6.
Figure 12:
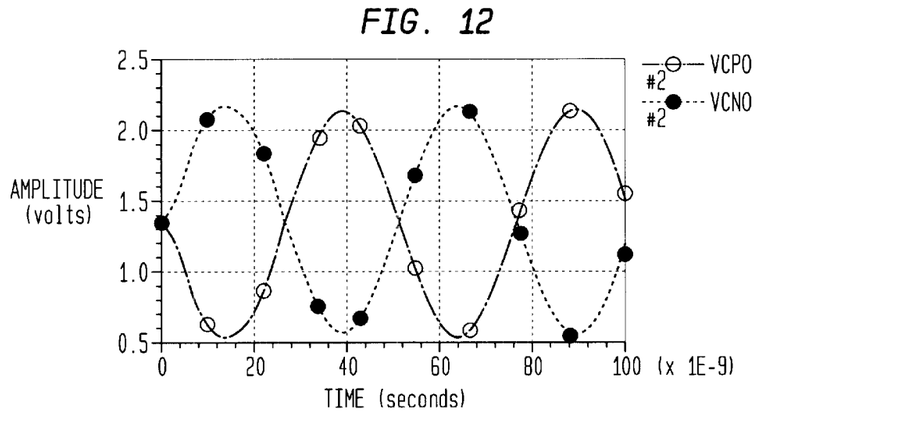
FIG. 12 shows the single-ended waveforms for VCPO and VCNO output from differential CV2VC of FIG. 6.

FIG. 10 shows AC gain versus frequency showing the signal VA1 generated by voltage follower amplifier 301. The relatively flat input differential control voltage VCINDF is applied to voltage-follower amplifier 301. VA1 has a roll-off point (3dB down point) at about 100 MHz with 0dB of gain. VA2 is the output signal of first bipolar voltage driver pair 303, which in combination with first differential amplifier stage 302 is an attenuation amplifier for shifting the DC level and to prevent saturation of the SiGe bipolar transistors of second differential amplifier stage 304. The single-ended waveforms for VCPI and VCNI are shown in FIG. 11, and the single-ended waveforms for VCPO and VCNO are shown in FIG. 12.

While the exemplary embodiments of the present invention have been described with respect to particular circuit components, one skilled in the art would realize that the present invention may be embodied in many different circuit configurations. For example, while bi-polar transistors are shown and described, other similar components, such as FET transistors, may be selected in the alternative. In particular, while the present invention is described for accumulation-mode varactors, one skilled in the art would realize that other types of varactors or similar devices may be employed. Consequently, for the present invention, a varactor may be any device that exhibits a change in device capacitance based on a biasing voltage. For example, other types of varactors include: a) depletion mode NMOS varactor, b) bipolar Base-Emitter Junction varactor, c) bipolar Base-Collector Junction varactor, d) P+ to Ntub Junction varactor, and e) N+ to Ptub Junction varactor.

In addition, the present invention is not limited to the types of circuit configurations shown. For example, the present invention describes a particular circuit for voltage conversion and DC-level shifting, but one skilled in the art would recognize that many different circuits may accomplish a similar result. The present invention is described with respect to AC-coupling of the differential oscillating waveform between the varactors and output, with capacitors, but such AC-coupling may or may not be employed in other configurations. Also, the circuit component values are exemplary only, and particular values and additional components may be selected for higher or lower desired frequency of differential oscillating waveform.

A differential VCO operating in accordance with one or more embodiments of the present invention may provide the following advantages. First, using a differential control voltage to drive the varactors allows for nearly full utilization of the voltage-capacitance range of each varactor, while using half of the voltage headroom as may be employed in prior art designs. Second, the differential VCO provides relatively high common-mode noise rejection of the varactor drive circuit. The common-mode noise rejection maintains a relatively constant DC differential voltage across each varactor in the presence of added noise from the power supply and circuit noise generated by other sources within, for example, an integrated circuit. Third, by AC-coupling of the varactors to the output oscillation waveform, the amplitude of the oscillation voltage seen by each varactor is reduced by the capacitive divider ratio. This allows for greater oscillation amplitudes for the differential VCO while generating less non-linear distortion (caused by the varactor). Fourth, phase noise performance is relatively improved over prior art circuits because 1) phase noise is inversely proportional to the oscillation voltage amplitude squared; and 2) an overall LC-tank Q enhancement results if the quality factor of the AC coupling capacitor is greater than that of the varactor. Fifth, lower VCO gain by AC coupling the output oscillation waveform lowers the magnitude which unwanted noise voltage variations vary the phase of oscillation, thus lowering the resultant phase noise. Having a circuit with greater VCO output signal frequency range by using more of the available voltage-capacitance range of the varactors allows the circuit to be used at a greater range of frequencies and allows greater margin for variations introduced into IC designs during the manufacturing process.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A voltage-controlled oscillator comprising:
 a voltage-to-voltage converter configured to adjust a gain of an input differential voltage and to shift a DC level of the differential input voltage to generate a differential control voltage, the voltage to voltage converter comprising:
  a voltage-follower amplifier is configured to provide a relatively high input impedance to a circuit providing the differential input voltage;
  a first differential amplifier stage is configured to shift the DC level of the differential input voltage; and
  a second amplifier stage is configured so as to provide a predetermined overall gain of the voltage-to-voltage converter, the overall gain including a gain of the voltage-follower amplifier and the first differential amplifier stage,
 wherein the voltage to voltage converter applies the overall gain to the differential input voltage; and
 a differential VCO comprising:
  an inductance/capacitance (LC) tank circuit having a pair of varactors configured back-to-back, wherein capacitance of the back-to-back varactors contributes to capacitance of the LC-tank circuit; and
  a differential amplifier having its differential output terminals coupled through the LC-tank circuit to its differential input terminals in a feedback path configuration,
 wherein the VCO receives the differential control voltage applied across each varactor to set capacitance of each varactor; and the differential amplifier generates an oscillating waveform in the feedback path at a frequency that is a function of the capacitance and inductance of the LC-tank circuit.

2. A voltage-controlled oscillator (VCO), comprising:
 an inductance/capacitance (LC) tank circuit having a pair of varactors configured back-to-back, wherein capacitance of the back-to-back varactors contributes to capacitance of the LC-tank circuit;
 a differential amplifier having its differential output terminals coupled through the LC-tank circuit to its differential input terminals in a feedback path configuration; and
 a voltage-to-voltage converter configured to adjust a gain of an input differential voltage and to shift a DC level of the differential input voltage,
 wherein the VCO receives a differential control voltage applied across each varactor to set capacitance of each varactor; and the differential amplifier generates an oscillating waveform in the feedback path at a frequency that is a function of the capacitance and inductance of the LC-tank circuit.

3. The VCO as recited in claim 2, wherein each varactor includes 1) a common terminal where the pair of back-to-back varactors are coupled back-to-back, the common terminal coupled to one component of the differential control voltage, and 2) a separate terminal coupled to a complement component of the differential control voltage.

4. The VCO as recited in claim 3, wherein the inductance of the LC-tank circuit includes a pair of inductors, each inductor coupled between a source voltage driving the differential amplifier and the separate terminal of a corresponding varactor.

5. The VCO as recited in claim 4, wherein each inductor is coupled between the source voltage and the separate terminal of a corresponding varactor with a capacitor.

6. The VCO as recited in claim 3, wherein the oscillating waveform includes a pair of differential oscillation components, each differential oscillation component being AC-coupled to a corresponding output terminal through a capacitor.

7. The VCO as recited in claim 2, wherein the differential amplifier comprises a pair of cross-coupled transistors.

8. The VCO as recited in claim 2, wherein the gain and the DC level is set to adjust a DC bias point across each varactor so as to increase an available range of capacitance for the varactor.

9. The VCO as recited in claim 2, wherein the voltage-to-voltage converter comprises a voltage-follower amplifier, a first differential amplifier stage, and a second differential amplifier stage, wherein:

the voltage-follower amplifier is configured to provide a relatively high input impedance for the voltage-to-voltage converter, the first differential amplifier stage is configured to shift the DC level, and the second amplifier stage is configured so as to provide a predetermined overall gain of the voltage-to-voltage converter, the overall gain including a gain of the voltage-follower amplifier and the first differential amplifier stage.

10. The VCO as recited in claim 9, wherein each of the first and second differential amplifier stages is coupled to a corresponding voltage driver pair of transistors to isolate the differential amplifier stage and drive its differential output signal.

11. The VCO as recited in claim 2, wherein each varactor is either i) an accumulation mode NMOS varactor, ii) a depletion mode NMOS varactor, iii) a bipolar Base-Emitter Junction varactor, iv) a bipolar Base-Collector Junction varactor, v) a P+ to Ntub Junction varactor, or vi) a N+ to Ptub Junction varactor.

12. The VCO as recited in claim 2, wherein the circuit is embodied in an integrated circuit.

13. A method of generating an oscillation waveform with a voltage controlled oscillator (VCO) comprising the steps of:

(a) coupling an inductance/capacitance (LC) tank circuit in a feedback path between input and output terminals of a differential amplifier, the LC tank having a pair of varactors configured back-to-back and capacitance of the back-to-back varactors included in capacitance of the LC-tank circuit; and (b) applying a differential control voltage across each varactor to set capacitance of each varactor;

(c) generating, by the differential amplifier, an oscillating waveform in the feedback path at a frequency that is a function of the capacitance and inductance of the LC-tank circuit; and (d) adjusting a gain of an input differential voltage and shifting a DC level of the differential input voltage to generate the differential control voltage that increases an available range of capacitance for the varactor.

14. The method as recited in claim 13, wherein step (a) comprises the step of:

(a1) AC-coupling the inductance of the LC tank between the pair of output terminals and a source voltage; and wherein step (b) comprises the step of:

(c2) AC-coupling the oscillating waveform in the feedback path across the pair of output terminals.

* * * * *